(12) United States Patent
Denvir

(10) Patent No.: US 7,609,311 B2
(45) Date of Patent: Oct. 27, 2009

(54) AUTOMATIC CALIBRATION OF ELECTRON MULTIPLYING CCDS

(75) Inventor: Donal Denvir, Belfast (GB)

(73) Assignee: Andor Technology PLC, Belfast (GB)

( * ) Notice: Subject to any disclaimer, the term of this patent is extended or adjusted under 35 U.S.C. 154(b) by 599 days.

(21) Appl. No.: 11/335,889

(22) Filed: Jan. 19, 2006

(65) Prior Publication Data

US 2006/0163474 A1 Jul. 27, 2006

(30) Foreign Application Priority Data

Jan. 20, 2005 (GB) .................................. 0501149.9

(51) Int. Cl.
*H04N 3/15* (2006.01)
*H04N 5/335* (2006.01)

(52) U.S. Cl. .................. 348/311; 348/294; 348/300; 348/301

(58) Field of Classification Search ................. 348/311, 348/294, 300, 301
See application file for complete search history.

(56) References Cited

U.S. PATENT DOCUMENTS

| | | | |
|---|---|---|---|
| 3,898,452 A * | 8/1975 | Hertel | 250/207 |
| 6,444,968 B1 * | 9/2002 | Burt et al. | 250/208.1 |
| 7,420,605 B2 * | 9/2008 | Pool et al. | 348/311 |
| 2002/0093288 A1 * | 7/2002 | Spencer et al. | 313/523 |
| 2003/0042400 A1 * | 3/2003 | Hynecek | 250/208.1 |
| 2005/0056771 A1 * | 3/2005 | Atlas et al. | 250/208.1 |

* cited by examiner

*Primary Examiner*—James M Hannett
(74) *Attorney, Agent, or Firm*—Porter, Wright, Morris & Arthur, LLP

(57) ABSTRACT

A method of determining the gain of an electron multiplier, especially in an Electron Multiplying Charge Coupled Device (EMCCD). The electron multiplier multiplies, in use, signals received from a device, typically a CCD, comprising photodetectors. A test signal is input to the electron multiplier from the device, and the gain of the electron multiplier is determined from the output of the electron multiplier. The test signal comprises, or is derived from, electrical charge generated by the photodetectors other than as a result of the incidence of an electromagnetic signal on the photodetectors. The test signal comprises, or is derived from, dark current, or clock induced charge.

24 Claims, 4 Drawing Sheets

AUTOMATIC CALIBRATION OF ELECTRON MULTIPLYING CCDS

FIELD OF THE INVENTION

The invention relates to electron multiplying structures, especially but not exclusively when used in Charge Coupled Devices (CCDs), and in particular to the calibration of same.

BACKGROUND TO THE INVENTION

An Electron Multiplying Charge Coupled Device (EM-CCD) is a type of CCD device and is normally manufactured using standard CCD fabrication techniques. Examples of known EMCCDs are provided by E2V under the Trade Mark L3 Vision, and by Texas Instruments under the Trade Mark Impactron. Like CCDs, EMCCDs may be used in cameras, or other apparatus, to capture images, or other optical data, by means of the photoelectric effect.

FIG. 1 shows a schematic view of a conventional Frame Transfer EMCCD, generally indicated as 10. There are other types of conventional EMCCD and it will be understood that the invention described hereinafter is also applicable to these. The EMCCD 10 comprises an array 12 of photoelectric cells 14, or photodetectors. These are commonly referred to as pixels. The array 12 typically comprises a conventional CCD array. The array 12 is commonly a two dimensional array, the number of rows and columns varying from device to device. In some cases, the array may be one dimensional, i.e. may comprise a single row of cells 14. In some CCD types, the array 12 may include a first, or image, section 16 and a second, or storage, section 18. During use, photons impinge upon the cells 14 in the image area 16, each cell 14 generating one or more electrons, i.e. a quantity of electrical charge, (by means of photo-generated electron-hole pairs the photoelectric effect) depending on the level of incident radiation. Each cell 14, and more particularly the data derived therefrom, provides an element, or pixel, of each image, or other data set, captured by the EMCCD 10. The second section 18 of the array may be referred to as the storage area, the data, or charge, generated at the image area 16 being transferred or shifted to the storage area 18 after capture. The cells 14 of the storage area 18 are usually masked, typically with a deposited layer of aluminium, to prevent photons from impinging thereon.

For two dimensional arrays, a shift register 20, normally a serial shift register, comprising a plurality of cells or stages 23 is associated with the array 12, through which data is read from the array 12 during use. Typically data, in the form of electrons or charge, is transferred from the array 12 into the shift register 20 one row at a time. Normally, one end 22 of the shift register 20 is connected to a charge to voltage amplifier 24, the data in the register 20 being shifted serially out of the shift register 20, via end 22, and through the amplifier 24 producing output signal 29.

The cells 14 and register 20 are formed from any suitable semiconductor material and the shifting, or transfer, of electrons, or charge, from one cell 14, 23 to another is effected by control signals in the preferred form of clock signals. The clock signals normally take the form of voltage signals which, by appropriate manipulation of the electric fields in the cells 14, 23, cause the electrons to move, or transfer between cells 14, 23. Typically, the transfer of data, or electrons, from image area 16 of the array 12 to the storage area 18 is controlled by a combined clocking of a first set of clock signals (applied at inputs 50) and a second set of clock signals (applied at inputs 52). The transfer of data, or electrons, from the storage area 18 (when present) is controlled by the second set of clock signals 52 and the transfer of data, or electrons, from the register 20 is controlled by a third set of clock signals (applied at inputs 54). Typically, each set of clock signals comprises at least two (sometimes three or four) clock signals, each signal within a set usually being referred to as a phase, each respective set being applied, in use, to each respective cell or stage 14, 23.

The key distinguishing feature of an EMCCD in comparison with a conventional CCD is the provision of a structure 26 between the end 22 of the shift register 20 and the output amplifier 24. The structure normally comprises a solid state electron multiplier and is commonly referred to as the EM gain register or Charge Multiplication Register. The EM gain register 26 normally takes the form of a shift register, usually a serial shift register, that may be generally similar to shift register 20 and so comprises a plurality of stages or cells 27. The transfer of data, or electrons, through or from the EM gain register 26 is controlled by a fourth set of clock signals (applied at inputs 56).

The principle of operation of an EMCCD is now described with reference to a typical 3 phase CCD shift register structure. FIGS. 2A and 2B show a schematic representation of a portion of a shift register, generally indicated as 21, that is suitable for use as the EM gain register 26. A plurality of electrodes or terminals 28 are associated with the register 21 for applying control signals to the register 21. Adjacent terminals 28 supply different or respective control signals so that a potential difference is created between adjacent terminals 28. The potential difference between adjacent terminals 28 creates an electric field at the associated portion of the register 21 thereby causing electrons to move, or transfer, along the register 21 from one stage or cell to the next. This is known as charge transfer. By appropriate co-ordination of the control signals, electrons can be shifted along the register 21 to the output of the register 21 to create an output signal for supplying to the amplifier 24. Hence, the data obtained from the array 12 is shifted along the register 21.

In the present example, the control signals include three voltage clock signals, or phases, that may be designated as R1, R2 and R3 (alternatively there may be 2 or more phases and corresponding control signals). As for normal CCD shift registers (for example register 20), each phase is applied, via a respective terminal 28, to each stage or cell of the register 21 in a fixed sequence (e.g. R1, R2, R3). In order that the shift register 21 may serve as an EM gain register, an additional terminal 28A is provided for each stage or cell, the additional terminal 28A supplying a fixed reference signal (e.g. a d.c. signal). By way of example, in FIGS. 2A and 2B, electrode 28A is provided between the electrodes that supply the R1 and R2 phases. Electrode 28A is held, during use, at a fixed potential and the adjacent electrode 28B (which in this example applies the R2 phase) is clocked, i.e. supplies a clock signal for the R2 phase, as normal, except that a higher voltage amplitude is used than is necessary for charge transfer alone. For example, for normal charge transfer the clock amplitudes are typically 6 to 15V depending on actual CCD and its exact design, and those required for EM gain are typically 20V to 50V depending on actual CCD and its exact design. The arrangement of the fixed voltage, or d.c., electrode 28A and the clocked electrode 28B, and the relatively large voltage difference between them (hereafter referred to as the EM voltage), results in an intense electric field (hereafter referred to as the EM field) in the associated portion of the register 21 which is sufficiently high that the transferring electrons cause Impact Ionization. Impact Ionization generates new electrons, i.e. multiplication or EM gain, as illustrated in FIG. 2B (where, for reasons of clarity, only the multiplication transfer is shown since the skilled reader will be familiar with normal charge transfer in CCDs). The multiplication of electrons per transfer is relatively small, typically around ×1.01 to ×1.015. This may seem insignificant but when executed over a large number of transfers, a substantial EM gain is achieved. For example, with ×1.015 multiplication per transfer performed over, say, 591 transfers (which is typical but not limiting), a gain of 1.015 to the power of 591 (a multiplication factor of 6630) is achieved. Such gain levels signify that EMCCDs possess sensitivities every bit as good as, and better than, the very best ICCDs and Electron Bombardment CCDs (EB-CCDs).

Taking the example above, one electron fed into the EM gain register 26 should give 6630 electrons out, although it is noted that this is 6630 on average and in reality there will be a spread of outcomes. The statistical nature of this multiplication has been analysed and the general formula describing the probability, $P_{(n,G,x)}$, of a certain number of electrons resulting at the output of the EM gain register 26 for a given number of input electrons, and for a given EM gain, may be given by:

$$P_{(n,G,x)} = \frac{x^{(n-1)} e^{-\frac{x}{G}}}{G^n (n-1)!} \quad [1]$$

Where n is the number of input electrons, G is the total EM gain, and x is the number of output electrons.

The EM gain is a function of the EM voltage and of the operating temperature, the gain can typically be measured by taking the ratio of a given signal, e.g. a test signal, with the gain on and then with the gain off. Gain off can be achieved by using a lower clock amplitude at electrode 28B, i.e. an amplitude substantially the same or similar to that used for normal charge transfer in a CCD. The test signal is typically derived from a test image generated from a stable light source—no radiometric source or specific wavelength is required since only a ratio of the charge generated needs to be determined. Calibration of the EMCCD 10 at the time of manufacture, i.e. factory calibration, typically involves measuring the EM gain for different EM clock voltages and temperatures and then using this information to adjust the operating EM voltage range to give the desired performance. The dependence of EM gain on clock amplitude (or more specifically on the EM voltage) is very sharp (see FIG. 3, noting the log scale which shows typical EM gain as a function of EM clock voltage for a specific EMCCD) and so requires stable electronic design. The dependence on temperature is less sharp but good operating temperature stability is also required (see FIG. 4 which shows typical EM gain as a function of temperature for different EM clock voltages).

Some EMCCDs do have a particular problem, commonly known as the ageing effect, whereby the EM gain decreases with usage. The term usage relates to the cumulative amount of charge accelerated through the EM field. The ageing effect appears to be dependent on the amount of charge passed through the EM gain register 26 combined with the EM field strength that the charge is transferred through. It also appears to be very strongly dependent on the EM field strength and so, when the EMCCD 10 is operated at high EM gains, the ageing rate can be disproportionately greater. Fortunately it has been observed that the ageing effect itself decreases with time meaning that with proper use the device should remain useful for many years.

The explanation for the ageing effect is not fully understood but it is assumed that accelerating charge through high electric fields is causing charge to become embedded in an insulating layer (not shown), typically formed from silicon dioxide, that is provided between the EM electrodes 28B and the active silicon (or other semiconductor material) from which the stages 27 of the register 26 are formed. It is assumed that this slow build-up of charge effectively reduces the field strength produced by the electrodes 28B. Independent of the mechanism involved, this reduction in field strength can be compensated for by increasing the EM voltage. However, this normally requires a re-calibration of the EMCCD 10, essentially a repeat of the factory calibration. This calibration could be repeated and the adjustments to the EM voltage range made so as to bring the camera back to its original performance. Alternatively, the new calibration data could be recorded and used without any actual adjustments being made, but either way a re-calibration, or measurement of the EM gain is required.

The temperature dependence of the EM gain is not a significant problem because it does not change with time and is not sharply dependent on temperature. Therefore any re-calibration of the EM clock amplitude, or EM voltage, can be done at one temperature and extrapolated to other temperatures. The only proviso is that the temperature chosen should ideally be within the range of anticipated operating temperatures. High-end cameras would typically be operated at between −50° C. and −100° C., whereas volume market cameras would be operated typically between −20° C. and 0° C.

As mentioned above, the dependence of EM gain on clock amplitude is very sharp and because the ageing is strongly dependent on the EM field used inside the silicon (or other semiconductor material from which the register 26 is made), fields no higher than are required to achieve the desired gain should be used (i.e. within normal operating ranges), otherwise the ageing effect is accelerated. Therefore, any calibration procedure needs to be carefully controlled. This may be relatively straightforward at the time of manufacture, but is problematic when performed at the user's site, especially when being performed by an inexperienced user. Regular factory recalibrations are a solution, but this would necessitate the apparatus containing the EMCCD, typically a camera, being returned to the factory, and, in any event, the user cannot know that calibration is required without measuring the EM gain.

It would be desirable, therefore, to facilitate automatic re-calibration of EMCCDs without the need for skilled intervention by the user and/or extra external hardware (e.g. stabilised light source).

SUMMARY OF THE INVENTION

Accordingly, a first aspect of the invention provides a method of determining the gain of an electron multiplier, the electron multiplier being arranged to multiply, in use, signals received from a device comprising at least one photodetector, the method comprising causing a test signal to be input to the electron multiplier from the device; and determining the gain of the electron multiplier from the output of the electron multiplier, wherein said test signal comprises, or is derived from, electrical charge generated by said at least one photodetector other than as a result of the incidence of an electromagnetic signal on said at least one photodetector.

In some embodiments, the test signal comprises, or is derived from, dark charge or dark current. Alternatively, or in addition, the test signal comprises, or is derived from, clock induced charge (CIC), or spurious charge. Dark charge is the charge or electrons that accumulate as a result of darkcurrent. CIC is also known as Spurious Charge.

In one embodiment, the method includes causing the test signal to be input to the electron multiplier when the gain of the electron multiplier is enabled and when the gain of the electron multiplier is disabled, and said gain being determined by comparing the output of the electron multiplier in response to said test signal when the gain of the electron multiplier is enabled to the output of the electron multiplier in response to said test signal when the gain of the electron multiplier is disabled.

The method may further include increasing or promoting darkcurrent and/or CIC in said device. This may be achieved by any suitable means, for example by appropriate selection and/or configuration of one or more control, or clock, signals that effect the transfer of charge in said device. For example, by setting one or more of said clock signals to have an amplitude that is sufficiently high to promote CIC during charge transfer. Typically, the amplitude is at least 25% and preferably at least 50% above the amplitude normally used to effect charge transfer. Darkcurrent may, for example, be increased by arranging for one or more of said clock signals to be unpinned (this can result in darkcurrent increases of 1 to 2 orders of magnitude). CIC may alternatively or additionally be promoted by increasing the periods of at least one of said clock signals, typically to the order of more than 10 and preferably several tens of milliseconds.

In another embodiment, the gain of the electron multiplier is determined by analysing the characteristics of the output of the electron multiplier in response to said test signal when the gain of the electron multiplier is enabled. Preferably, said characteristics include events caused by the input of respective single electrons to said electron multiplier. The analysis may involve comparing the characteristics of the detected or measured output against known output results (e.g. by curve fitting or other mathematical techniques) or predicted output results (e.g. by curve fitting or other mathematical techniques).

In preferred embodiments, the method further includes adjusting the gain of the electron multiplier in response to the determined, or measured, gain.

A second aspect of the invention provides an apparatus for detecting the gain of an electron multiplier, the apparatus comprising means for causing a test signal to be input to the electron multiplier from a device comprising at least one photodetector; and means for determining the gain of the electron multiplier from the output of the electron multiplier, wherein said test signal comprises, or is derived from, electrical charge generated by said at least one photodetector other than as a result of the incidence of an electromagnetic signal on said at least one photodetector. In preferred embodiments, the apparatus includes at least one CCD or EMCCD.

A third aspect of the invention provides an apparatus comprising at least one charge coupled device (CCD) and an electron multiplier, the electron multiplier being arranged to multiply, in use, signals received from the at least one CCD, the apparatus further including an apparatus of the second aspect of the invention.

Conveniently, the method of the invention may be implemented wholly or partially by computer software, or computer program code, which may be executed by a microprocessor, microcontroller or other computer included in or associated with the apparatus.

A fourth aspect of the invention provides a computer program product comprising computer program code for causing a computer to perform the method of the first aspect of the invention.

Further advantageous aspects of the invention will become apparent to those ordinarily skilled in the art upon review of the following description of specific embodiments of the invention.

BRIEF DESCRIPTION OF THE DRAWINGS.

Specific embodiments of the invention are described hereinafter by way of example and with reference to the accompanying drawings in which.

DETAILED DESCRIPTION OF THE DRAWINGS

Figure 1:
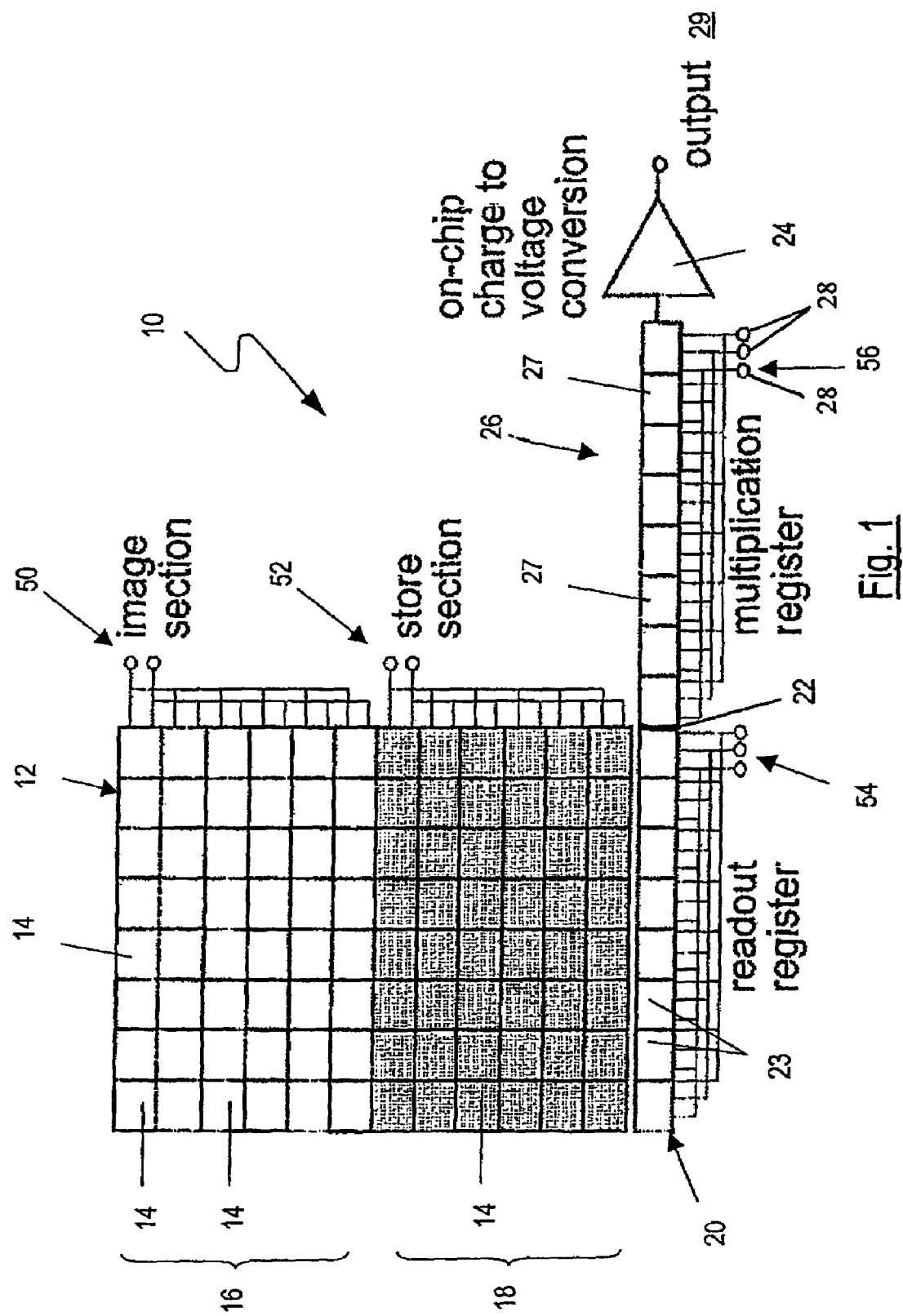
FIG. 1 is a schematic view of a Frame Transfer type EMCCD.
Figure 2A:
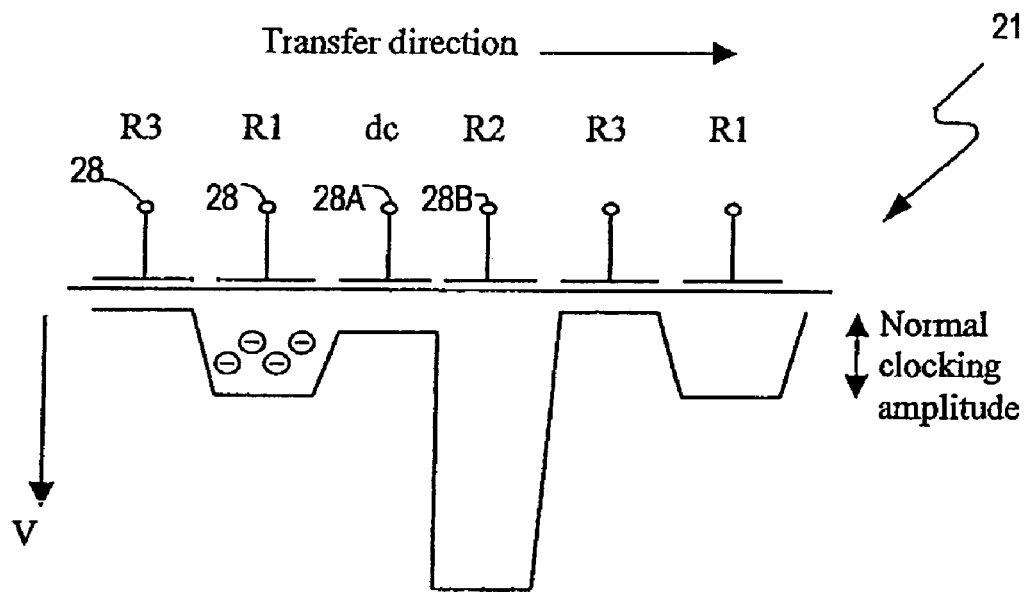
FIGS. 2A and 2B are schematic representations of a typical EM gain register and of the operating signals applied thereto, as included in the EMCCD of FIG. 1.
Figure 2B:
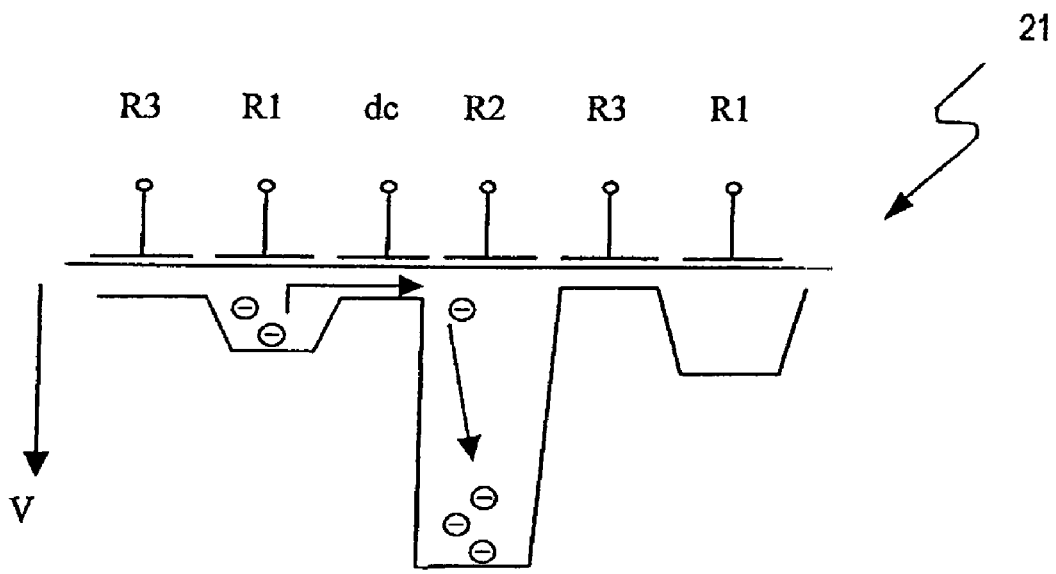
Figure 3:
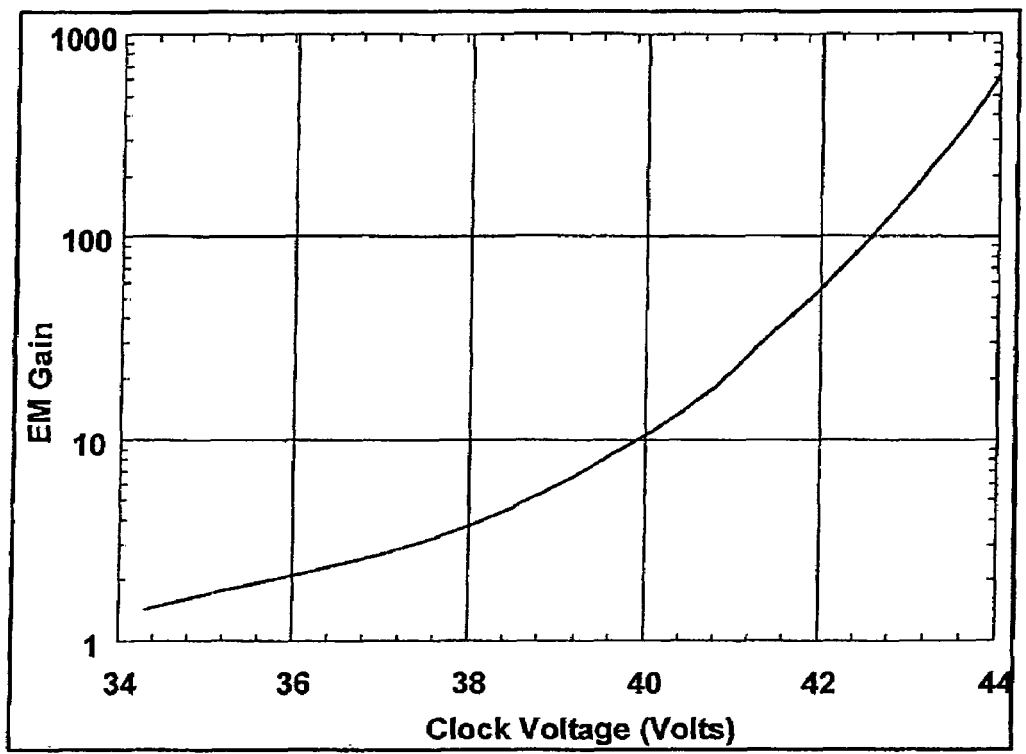
FIG. 3 is a graph showing, by way of typical example, EM gain as a function of EM clock voltage for a specific EMCCD.
Figure 4:
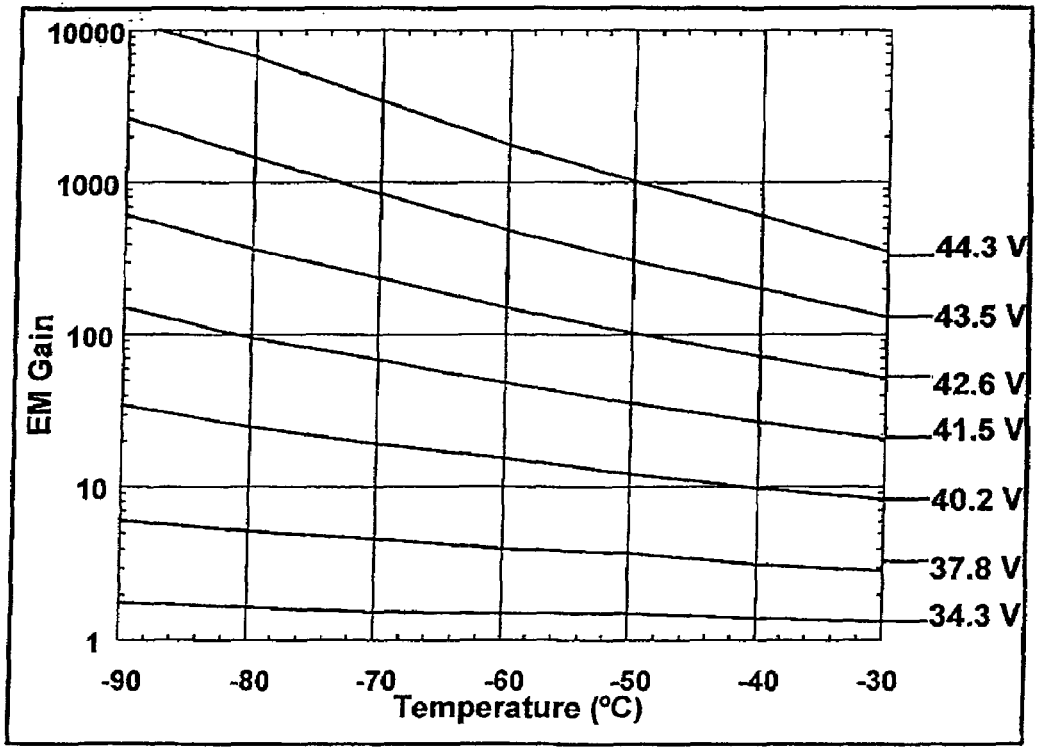
FIG. 4 is a graph showing by way of typical example, EM gain as a function of temperature for different EM clock voltages for a specific EMCCD.

The invention may be employed with an EMCCD of the general type shown in FIG. 1, or with any other CCD type, e.g. frame transfer (FT), interline, full-frame (FF), Frame Interline (FI) and others. The embodiments presented hereinafter are described in the context of a specific EMCCD and it will be understood that the invention is applicable to any other EMCCD, as would be apparent to a skilled person.

Means for determining when the EM gain has fallen off, or decreased, is provided. Preferably, means for re-calibrating, or adjusting, the EM gain is also provided. The selected method of calibration may depend on the exact usage of the camera (or other apparatus of which the EMCCD forms part). For example, there are two typical uses of an EMCCD-based apparatus (e.g. a camera):

1) An apparatus/camera performing a routine measurement inside a larger instrument (e.g. a gene chip reader). Such an instrument usually runs routine diagnostics for different aspects of its operation and these would be ideal times for the re-calibration or adjustment of the EM gain.
2) Applications where the apparatus/camera is acquiring data continuously (e.g. surveillance). In such applications, it would be desirable to use a calibration method that does not interfere with the normal continuous operation of the apparatus.

Whatever the application of the apparatus/camera, any calibration involves having means for measuring the EM gain. To perform EM gain measurement, it needs to be possible to feed a quantity of controlled charge, i.e. one or more electrons, into the gain register 26. Where this charge comes from does not matter and the most obvious source is an external optical signal. Conventionally, this would comprise an external, stabilised light source that could be attached to the camera without any light leaks. Some CCDs are provided with charge injection gate (CIG) structures built into the device itself. CIGs could be used to provide the charge, although current EMCCDs tend not to contain CIGs and, in any event, existing CIGs are not ideal for this purpose. New designs could include such or similar structures specifically designed for EM gain calibration purposes. A stabilised light source could be built into the apparatus/camera, and this has been done before (for non-EMCCD cameras) for other reasons. This would work, but has some problems, the main problems being that the internal light source must not interfere with the incoming light when in normal use, and the additional cost.

In preferred embodiments of the invention, it is proposed to make use of darkcurrent and/or Clock Induced Charge (CIC) as a signal source, i.e. to provide charge, or one or more electrons, to the EM gain register 26, in order to measure EM gain.

Clock Induced Charge (CIC), also known as Spurious Charge, is the occasional generation of charge during the normal clocking process. This phenomenon is not unique to EMCCDs and exists in all types of CCDs but, when a CCD or EMCCD is properly operated, the amounts of charge generated can be negligibly small, e.g. only one electron may be generated for every 10 or 100 transfers, or even less.

Darkcurrent, sometimes referred to as leakage current, comprises background signals or current that are present in a CCD or EMCCD and which do not result from the incidence of radiation on the CCD/EMCCD array. Darkcurrent arises primarily as a result of thermally produced free electrons.

It is proposed to use darkcurrent and/or CIC as a signal source for measurements of the EM gain. Two preferred methods are described hereinafter:

1) Measure the amount of darkcurrent and/or CIC with and without EM gain applied; and take the ratio of the respective detected darkcurrent and/or CIC values to ascertain the EM gain. If necessary, clock levels and patterns may be altered from their normal settings so that the darkcurrent and CIC are enhanced to facilitate the measurement.

2) Without necessarily altering clock levels or patterns from normal settings, and through Equation 1 above, the statistical distribution of discrete single events arising from darkcurrent and/or CIC is used to ascertain EM gain.

Method 1 may be used in cases where there is sufficient darkcurrent and/or CIC. Conventionally, it may be thought that this would limit the method to modestly cooled apparatus/cameras, say −30° C. and above. This is not so, as is explained below. Normally, EMCCD equipment manufacturers strive to minimise both darkcurrent and CIC by deep cooling (usually below −50° C.) and by careful clocking of the CCD chip respectively. In high-end apparatus/cameras, the usual levels of darkcurrent and CIC are very low and in practice it would take hours, or perhaps days, to capture enough charge to perform calibration with useful accuracy. However, with suitable electronic hardware and software of the type typically used in high-end scientific cameras, a CCD/EMCCD can be operated so as to increase either darkcurrent or CIC or both above the levels that are typically present during normal use. By way of example, darkcurrent can be increased by using an unpinned (non-inverted mode) clocking pattern or signal. Typically, this means that the low level of the clock signal is not tied or pinned to a value that is at a sufficiently low potential relative to the CCD substrate to inhibit the surface darkcurrent (which is the largest component of darkcurrent) during the low periods of the clock cycle. Higher clock amplitudes than would normally be used when clocking a CCD may be used to increase CIC. For example, if the normal amplitude of the clock signal is in the region of 10 to 12V, then an increase of amplitude to approximately 15V or more should effect the desired increase in CIC. In general, an increase of at least 25%, and more preferably of at least 50%, is preferred. Alternatively, or in addition, changing clock periods can increase CIC. For example, the clock period may be increased (in comparison with the period of the clock signal used during normal operation of the CCD) to a length that promotes CIC. This is typically tens of microseconds as compared to a few microseconds or less as used for normal charge transfers. The former option can generate very large amounts of signal, up to 1 electron per transfer without exceeding the maximum electrode voltage rating. CIC generation is largely independent of CCD temperature, which is important for deep cooled systems where darkcurrent may be too small to be of practical use. It is a common misconception that CIC is very temperature dependant because it is well known that Impact Ionization is very dependant on temperature, but when the negative temperature dependence of state lifetimes is taken into account, CIC generation is found to be only slightly dependant on temperature.

Methods of increasing CIC may be applied to any part or combination of two or more parts of the EMCCD 10 including the image area 16, storage area 18, the serial register(s) 20 and/or EM gain register(s) 26. Various normal CCD readout methods, or combinations thereof, of integrating, binning and/or accumulating may also be used to facilitate the measurement. This means that an accurate calibration of the EM gain can be performed in a short time without the need of any external stabilised light source or other external apparatus. In some cases, the user/operator may have to ensure that the camera is in darkness when the EM gain measurement/calibration is being performed. In cases where, the apparatus/camera has an integral shutter, the entire operation can be performed without any user input apart from initiating the measurement/calibration routine (which would typically involve causing the shutter to close.) In the case of frame transfer CCDs (FT) or interline CCDs, even a shutter may not be required since each CCD type has a storage area that is covered (usually by a directly applied mask, typically formed from aluminium) and these areas can be used to generate the increased CIC or darkcurrent. In such cases, the image area 16 would not be clocked and, when present, antiblooming features of the CCD 10 would drain any excess charge being generated in the image area. Further, the controlling computer (not shown), typically a PC or other external computer but may alternatively or additionally comprise an on-board microprocessor, that controls, amongst other things, the operation of the EMCCD 10 including the clock signals, may be programmed to use its real-time clock to automatically and periodically alert the user to run the calibration/gain measurement procedure. Alternatively, the controlling computer may be programmed to use its real-time clock to automatically check and then automatically adjust the EM gain at predetermined intervals without the user ever needing to be aware. This automatic check and calibration may be performed at times that would not interfere with the normal intended usage of the apparatus/camera, for example, after execution of the camera software or during the night for continually operating systems.

A specific embodiment of the first method is now described by way of example. In this example, it is assumed, for the purposes of illustration only, that the EMCCD 10 comprises a known off-the-shelf EMCCD chip, namely the CCD97 as supplied by E2V. The calibration of EM voltage versus EM gain is performed for a single CCD operating temperature. The same calibration can be performed for other temperatures, but as indicated above this may not be necessary.

The CCD97 is an FT CCD device comprising an active image area of 512 by 512 pixels, and is similar to the EMCCD illustrated in FIG. 1. It has a maximum pixel readout speed of 11 MHz with a readout noise of 60 electrons RMS but does not have antiblooming. A full datasheet can be obtained from the e2v.com website. In this example, it is also assumed that the most demanding case of low temperature operation is between −50° C. and −100° C. since at these temperatures, the darkcurrent will be too low to be of practical use. At such temperatures, it is proposed to use a CIC generated signal. It is further assumed that when the image and storage areas 16, 18 are clocked by a clock signal with amplitude 15V, each cell 14 produces, in the form of CIC, 0.5 electrons (a typical value for this CCD and a value that is adopted for illustration purposes hereafter) per vertical transfer (i.e. a transfer downwardly (as viewed in FIG. 1) towards the register 20). This clock amplitude is approximately 4 volts above that required for normal charge transfer operation and low CIC.

In this example, the array 12 must be substantially isolated from incident light. This may be achieved by closing the shutter or, if the apparatus/camera has no shutter, by placing the apparatus/camera in darkness. Since the CCD97 does not have antiblooming, the shielded storage area 18 alone will not be used to make the EM gain measurement because any light falling on the image area could cause charge, thus generated, to bloom out of the image area into the storage area during the EM gain measurement. Therefore, the array 12 must be kept in darkness.

Advantageously, a series of 'keep clean' scans are performed to remove any residual photo-generated charge that may be present in the EMCCD 10. The scans may comprise any of a wide range of readout operations so long as they readout the whole EMCCD 10.

The output signal 29 is measured or recorded without EM gain being effected. This may be achieved by setting the control or clock signals 56 for the EM gain register 26 such that charge transfer is effected but that the EM voltage does not cause Impact Ionization. In the illustrated example, this may achieved by using a clock signal at the electrodes 28B with an amplitude used normally to effect charge transfer only (about 11V in this example), or at least not high enough to cause Impact Ionization.

In order to take a measurement from the output signal 29, a test signal must be supplied to the EM gain register 26. For simplicity we will ignore the dark reference and other non image pixels that exist on this CCD as accounting for them does not effect the basic principle or conclusions drawn below but only makes the example more difficult to follow. In this example, in order to obtain a test signal for the EM gain register 26, charge, or electrons, is gathered from all of the CCD array 12 (both the image and storage areas 16, 18) which, in this example, comprises 1024 cells 14 in the vertical direction (as viewed in FIG. 1) and 512 cells 14 in the horizontal direction (as viewed in FIG. 1). Alternatively, charge/electrons may be gathered from the image area 16 and/or the storage area 18 and/or the register(s) 20, and/or any other photoelectric cells in the EMCCD 10.

If the example array 12 is readout as a full resolution image, it only gives 0.5 electrons/pixel on average. Therefore, it is preferred to bin all 1024 vertical cell rows of array 12 to a respective single cumulative value (the resultant electrons/charge being stored in a respective stage 23 of register 20) and to readout each of the cumulated values as a single line (i.e. a serial read of register 20). This is known as Full Vertical Binning (FVB). It will be understood that other conventional methods of readout may alternatively be employed.

To achieve this, the respective clock signals 50, 52 that control charge transfer in the image area 16 and storage area 18 of array 12 are set to a CIC-promoting amplitude (e.g. 15V in this example) and used to transfer, or bin, the cells 14 vertically into the register 20, each pixel comprising a quantity of electrons or charge culminated from a respective column of the array 12 and stored in a respective cell 23, as described above. In the present example, this creates 512 binned pixels in the register 20, the number of electrons, or charge, associated with each pixel arising from CIC. Then, the clock signal 54 that controls the transfer of charge in the register 20 is used to transfer the contents of the register 20 serially into the EM gain register 26 (typically signals 54 and 56 are clocked in step as each pixel of register 20 is fed down the multiplication register and into amplifier 24 as a kind of 'pipeline'). Hence, a test signal generated by CIC is supplied to the EM gain register. In the present example, the register 20 is preferably clocked at a normal charge transfer amplitude, although in alternative embodiments it may be clocked at an elevated CIC-promoting amplitude.

Advantageously, each measurement of the output signal 29 is associated with a reference signal or level against which the output signal measurement can be compared. This may be referred to as the dark reference level and corresponds to "no signal present". In the present example, the dark reference level provides an output reference level with no CIC or at least no artificially increased CIC. Conveniently, the reference signal/level may be obtained using an overscan technique. Overscanning involves reading the CCD array 12 (i.e. taking a reading or measurement from the output signal 29) as if the array 12 were larger than it actually is. For example, the array 12 may be read as if its dimensions were 1024 cells by 1024 cells. This means that, as well as shifting the contents of register 20 obtained from the array 12 into the EM gain register 26, the register 20 is further clocked so that one or more dummy pixels (512 in this example) are transferred from the register 20 to the register 26 (after the transfer of CIC from the array 12 described above, the array 12 is not clocked to ensure that the dummy pixels do not comprise CIC). Therefore one half of the measurement, or image, taken from the output 29 comprises non-existent pixels (referred to as overscan or dummy pixels) while the other half will contain the test signal pixels (which in this example are generated by CIC). The dummy pixels or data serve as the reference level/signal.

Therefore, one readout (i.e. the measurement taken from the output signal 29) will, in the present example, consist of a single row of 1024 pixels, one half comprising the 512 background or dummy pixels, the other half comprising the CIC test signal with a 512 electrons/pixel signal on average (since each column of 1024 cells 14 in array 12 having 0.5 electrons/pixel were binned into a respective single pixel or cell 23).

Once the measurement is taken, the 512 background pixels and 512 CIC signal pixels may be respectively averaged, and the difference of the average values may be taken as the measured output value (typically in electrons). The total noise $N_T$ associated with this single readout measurement can be calculated as:

$$N_T = \sqrt{2\left(\frac{N_R^2}{512}\right) + S} \quad [2]$$

where $N_R$ is the readout noise (typically 60 electrons/pixel RMS) and S is the test signal (in this case the CIC signal of 512 electrons/pixel). The factor of two for the readout noise is included to allow for the readout noise from the background, or dummy, part of the test signal, and the 512 divisor is present because this is the number of pixels over which the measurement is averaged. The resultant Signal to Noise is S divided by $N_T$ and for this example is 22.3.

A second output measurement is required, this time with the EM gain activated. Hence, for the second output reading, the EM voltage (which is created by a clock voltage or other control signal) is set to a value commensurate with causing Impact Ionization (and therefore EM gain), preferably allowing any required time to settle. The resultant EM gain may be referred to as G. In this example, assume that G is 1000 (X1000). Hence, when a CIC test signal is generated as described above, the resultant output signal 29 will comprise 512,000 electrons/pixel in this example. This is close to the saturation level of the serial register 26 and is the reason it was elected not to use horizontal binning. The total noise $N_T$ associated with this readout will be:

$$N_T = \sqrt{2\left(\frac{N_R^2}{512G^2}\right) + F_N S} \quad [3]$$

The effect of the EM gain (and incidentally a key purpose of EM gain as opposed to conventional amplifier gain), is to reduce the readout noise by the factor G. However, it also adds a new noise source due to its stochastic nature. This is represented by the Noise Factor term $F_N$ which normally has a value of 1.4 for typical EMCCDs. This gives a Signal to Noise $(S/N_T)$ from equation [3] of 19.1. Note that EM gain is well suited for use with very weak signals but can be counterproductive when used with stronger signals.

To get a measured value for EM gain G, the ratio of the respective measured outputs with EM gain enabled and disabled is calculated. In the example where G is around X1000, this gives a Signal to Noise ratio of 10.3 (bearing in mind that noise adds when you ratio values). This is not particularly satisfactory since, for most practical cases, it would be desirable to have an EM gain measurement with an accuracy of at least one part in 100 (i.e. a Signal to Noise of 100). The CIC cannot readily be further increased in the present example because the voltages needed would exceed the maximum ratings for the CCD97 chip. Accordingly, repeated measurements are taken and accumulated. It is desired to improve the result by a factor of approximately 10 and so the measurement is repeated 100 times. Since each measurement takes less than 2 ms, a total measurement time of less than one second is possible.

The measurement of EM gain may be repeated for a range of EM voltage settings and a curve fit applied so that a value of EM gain could be obtained for any EM voltage setting. Further such measurements can be repeated at different temperatures if required.

In a preferred embodiment, Method 2 relies on the detection of single events and analyzing the statistics or characteristics of a large number of these single events. For an ideal CCD, i.e. one with no darkcurrent and no CIC, that is in darkness, the signal level readout for each pixel should be the same and only vary due to the readout noise of the CCD. This is also true for EMCCDs even with the EM gain set at high values, say X1000. Real CCDs do have darkcurrent and CIC, but with cooling and proper and normal operation these can be very low (by low we mean that most pixel or cell readouts correspond to zero electrons with only an occasional readout corresponding to one electron, say a ratio of 10:1 or higher e.g. a ratio of approximately 1000:1 is achievable). At these very low signal levels there is a negligibly small probability that a pixel or cell readout will correspond to 2 electrons or more. With an EM gain of X1000 (for example) the readouts, i.e. of the output signal 29, corresponding to one electron being input to the EM register 26, will have been multiplied up to 1000 electrons (on average) and will comprise a relatively large readout/output value compared to the neighbouring readout/output values corresponding to zero electron reads (i.e. the output value that corresponds to no electrons being input to the register 26). Hence, the readouts/output values corresponding to one electron will be detectable above the readout noise fluctuations. If the data stream, or output signal 29, is analysed over time, the output values corresponding to the single electrons appear as spikes in the output signal 29 and can be distinguished above the 'background' zero electron reads. These spikes may be referred to as single events. To ensure that the spikes, or events, are detectable, it is preferred that they occur sufficiently far apart that they can be readily distinguished from one another, i.e. it is preferred that the events are discrete events. This is achieved by ensuring that sufficiently low levels of darkcurrent/CIC are present.

To achieve these very low signal levels (e.g. less than one event, i.e. single electron, in every 10 readouts on average) the CCD should be deep cooled (−50° C. or lower) and clocked commensurate with low CIC—the actual clocking method or other techniques used are not important so long as the result is a low darkcurrent/CIC signal level. CCD equipment manufacturers usually strive to achieve this performance as a matter of course, and so it does not need to be described further here.

It is important to note that Method 2 can be made to work for signal levels higher than one events in 10 (on average), but that the analysis is much more complicated.

It should also be noted that Method 2 is only appropriate for EM gains that are high enough to multiply the single events above the readout noise of the CCD. Readout noises from CCDs and EMCCDs depend on the particular CCD design and the readout speed, among other things, but can be as high as 60 electrons RMS. Therefore, to detect single events and perform useful analysis, the EM gain should preferably be above 200.

Method 2 has the advantage that it can be implemented without interfering with the normal operation of the apparatus/camera even when running at relatively high frame rates. This is because the statistics can be gathered from, i.e. the events can be taken from, the portion of the output signal 29 that represents overscan pixels or rows that are commonly present during normal readout operations. In video applications, events can be detected during the field blanking time. This method is particularly suited for applications requiring continuous operation, e.g. in surveillance. In NTSC or PAL formats, for example, it would be possible to arrange to readout approximately 20 rows of overscan data per frame.

As is described in more detail below, the characteristics of the detected series of events can be compared against previously recorded, or predicted, data in order to determine the EM gain.

A specific example of Method 2 is now described by way of example. Again, the CCD97 is used as the illustrative device. In this example single event statistics are gathered with the CCD/EMCCD in darkness, and are used to measure the EM gain to an accuracy of 1% when that gain is approximately X1000 (note that the number of events needed so as to obtain a given accuracy will vary with gain). When operating at −90° C., 10 MHz readout speed, normal clocking, and in full resolution (i.e. no binning) image readout mode in darkness, this CCD device gives a typical event rate of 0.002 events/pixel. Since we are primarily interested in single electron input events (to the register 26), Equation [1] simplifies to:

$$P_{(G,x)} = \frac{e^{-\frac{x}{G}}}{G} \qquad [4]$$

Figure 5:
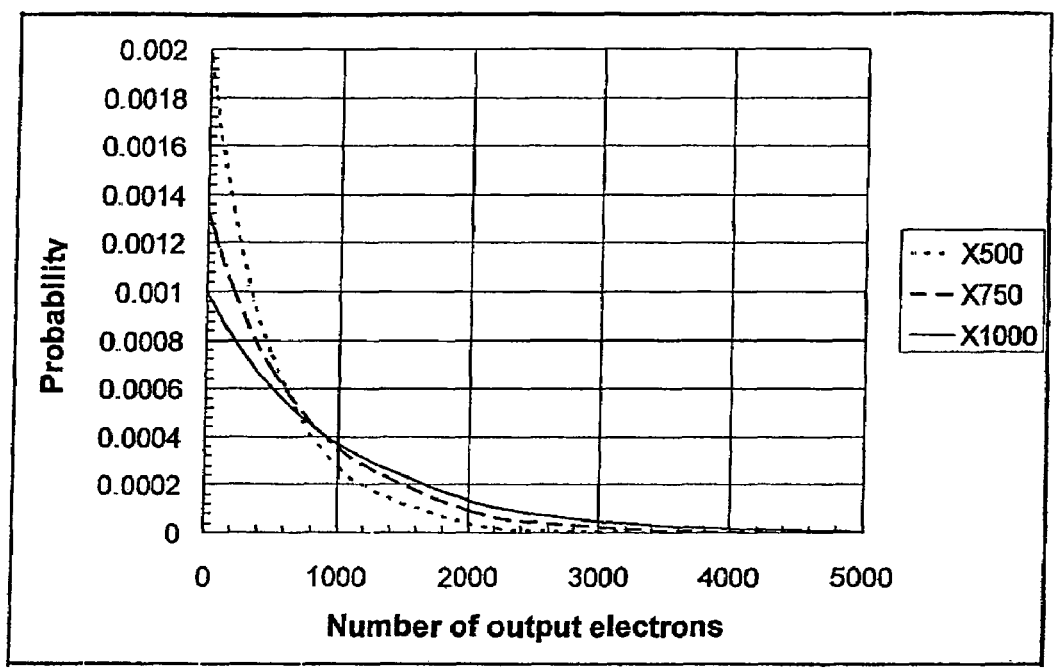
FIG. 5 is a graph showing EM gain register output probabilities for a single input electron for three different EM gains.

For illustration, FIG. 5 shows plots of this formula for three different EM gains. The y-axis plots probability and the x-axis is the number of output electrons, x, arising from a single input electron. The number of electrons is an integer and so FIG. 5 is really a histogram with an area of unity. In a dark image (which in this case comprises a full resolution image readout in the dark) from an EMCCD with a high EM gain (e.g. approximately X1000), the single events appear as randomly distributed spikes in the output signal 29 and are readily distinguishable from the readout noise floor. To gather the statistics, or characteristics, of the events, a threshold level may be set and any spike protruding above this threshold is counted as a single event and its height above the noise floor is measured (conveniently in electrons). The threshold needs to be set high enough so as not to mistake readout noise spikes as events, but not so high that insufficient events will be counted. Therefore, it is recommended to use three standard deviations of the noise floor, which is 180 electrons for this CCD device. Events are thus measured and Equation 4 is fitted to the characteristics of the measured events in order to determine EM gain. To know how many events that need to be gathered to give a specified accuracy, standard noise statistics may be applied to Equation [4] so that if N is the total number of events, then:

$$\frac{1}{N} = \sum_{x=180 \to \infty} (P_{(G^+,x)} - P_{(G^-,x)})^2 \qquad [5]$$

To get 1% accuracy in the EM gain at a gain of X1000, equation [5] can be solved for $G^+$ equal to 1005 and $G^-$ equal to 995; this yields approximately 8500 events. At an event rate of 0.002 events/pixel, and in an image of 512 by 512 pixels at a frame rate of 30 frames per second, this would take well under 1 second to accumulate. If overscan is employed and a very restricting case of only 1 overscan row per image is assumed, then it will take approximately 4 minutes to acquire enough statistics/data from output events to determine the EM gain. Since the apparatus/camera can still be used while these events are being acquired this need not be a problem at all.

In the embodiments described above, a specific readout mode is described. It will be understood that there are many readout modes incorporating many permutations of binning and accumulating that can be used to make the EM gain measurements described herein. Many of these are interchangeable but some are more useful than others depending on the CCD type (FT, interline, full-frame (FF), etc.), size, and operating temperature. These are standard and well known techniques and it is not practical to describe them all herein.

The invention is not limited to the embodiments described herein which may be modified or varied without departing from the scope of the invention.

The invention claimed is:

1. A method of determining the gain of an electron multiplier, the electron multiplier being arranged to multiply, in use, signals received from a device comprising at least one photodetector, the method comprising causing a test signal to be input to the electron multiplier from the device; and determining the gain of the electron multiplier from the output of the electron multiplier, wherein said test signal comprises, or is derived from, electrical charge generated by said at least one photodetector other than as a result of the incidence of an electromagnetic signal on said at least one photodetector, and wherein said test signal comprises, or is derived from, dark charge or dark current.

2. A method as claimed in claim 1, further including adjusting the gain of the electron multiplier in response to the determined, or measured, gain.

3. A method as claimed in claim 1, wherein said device comprises at least one charge coupled device (CCD).

4. A method as claimed in claim 1, further including causing dark current to be promoted in said device.

5. A method as claimed in claim 4, further including unpinning at least one control signal for effecting charge transfer in said device.

6. A method as claimed in claim 4, further including operating at least one clock signal in a non-inverted mode such that charge transfer is effected in said device.

7. A method of determining the gain of an electron multiplier, the electron multiplier being arranged to multiply, in use, signals received from a device comprising at least one photodetector, the method comprising causing a test signal to be input to the electron multiplier from the device; and determining the gain of the electron multiplier from the output of the electron multiplier, wherein said test signal comprises, or is derived from, electrical charge generated by said at least one photodetector other than as a result of the incidence of an electromagnetic signal on said at least one photodetector, and wherein said test signal comprises, or is derived from, clock induced charge, or spurious charge.

8. A method as claimed in claim 7, further including adjusting the gain of the electron multiplier in response to the determined, or measured, gain.

9. A method as claimed in claim 7, wherein said device comprises at least one charge coupled device (CCD).

10. A method as claimed in claim 7, further including causing clock induced charge to be promoted in said device.

11. A method as claimed in claim 10, further including configuring at least one control signal for effecting charge transfer in said device to promote clock induced charge.

12. A method as claimed in claim 10, wherein said at least one control signal is a periodic signal, the method further including setting said period set to promote clock induced charge during charge transfer.

13. A method as claimed in claim 10, wherein the amplitude of said at least one control signal is set to promote clock induced charge during charge transfer.

14. A method as claimed in claim 13, wherein said amplitude is at least 25% and preferably at least 50% above the amplitude required to effect charge transfer.

15. A method of determining the gain of an electron multiplier, the electron multiplier being arranged to multiply, in use, signals received from a device comprising at least one photodetector, the method comprising causing a test signal to be input to the electron multiplier from the device; and determining the gain of the electron multiplier from the output of the electron multiplier, wherein said test signal comprises, or is derived from, electrical charge generated by said at least one photodetector other than as a result of the incidence of an electromagnetic signal on said at least one photodetector, the method further including causing the test signal to be input to the electron multiplier when the gain of the electron multiplier is enabled, and when the gain of the electron multiplier is disabled; and determining the gain by comparing the output of the electron multiplier in response to said test signal when the gain of the electron multiplier is enabled to the output of the electron multiplier in response to said test signal when the gain of the electron multiplier is disabled.

16. A method as claimed in claim 15, further including adjusting the gain of the electron multiplier in response to the determined, or measured, gain.

17. A method as claimed in claim 15, wherein said device comprises at least one charge coupled device (CCD).

18. A method of determining the gain of an electron multiplier, the electron multiplier being arranged to multiply, in use, signals received from a device comprising at least one photodetector, the method comprising causing a test signal to be input to the electron multiplier from the device; and determining the gain of the electron multiplier from the output of the electron multiplier, wherein said test signal comprises, or is derived from, electrical charge generated by said at least one photodetector other than as a result of the incidence of an electromagnetic signal on said at least one photodetector, the method further including determining the gain of the electron multiplier by analysing the characteristics of the output of the electron multiplier in response to said test signal when the gain of the electron multiplier is enabled.

19. A method as claimed in claim 18, wherein said characteristics include events caused by the input of respective single electrons to said electron multiplier.

20. A method as claimed in claim 18, wherein the analysis involves comparing the characteristics of the detected or measured output against known output results or predicted output results.

21. A method as claimed in claim 18, further including adjusting the gain of the electron multiplier in response to the determined, or measured, gain.

22. A method as claimed in claim 18, wherein said device comprises at least one charge coupled device (CCD).

23. An apparatus for detecting the gain of an electron multiplier, the apparatus comprising means for causing a test signal to be input to the electron multiplier from a device comprising at least one photodetector; and means for determining the gain of the electron multiplier from the output of the electron multiplier, wherein said test signal comprises, or is derived from, electrical charge generated by said at least one photodetector other than as a result of the incidence of an electromagnetic signal on said at least one photodetector, and wherein said test signal comprises, or is derived from, dark charge or dark current.

24. An apparatus for detecting the gain of an electron multiplier, the apparatus comprising means for causing a test signal to be input to the electron multiplier from a device comprising at least one photodetector; and means for determining the gain of the electron multiplier from the output of the electron multiplier, wherein said test signal comprises, or is derived from, electrical charge generated by said at least one photodetector other than as a result of the incidence of an electromagnetic signal on said at least one photodetector, and wherein said test signal comprises, or is derived from, clock induced charge, or spurious charge.

* * * * *